United States Patent
Dow et al.

(10) Patent No.: US 12,355,212 B2
(45) Date of Patent: Jul. 8, 2025

(54) SEMICONDUCTOR LASERS AND PROCESSES FOR THE PLANARIZATION OF SEMICONDUCTOR LASERS

(71) Applicant: MACOM Technology Solutions Holdings, Inc., Lowell, MA (US)

(72) Inventors: Ali Badar Alamin Dow, Ithaca, NY (US); Jason Daniel Bowker, Dryden, NY (US); Malcolm R. Green, Lansing, OH (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 18/174,250

(22) Filed: Feb. 24, 2023

(65) Prior Publication Data

US 2023/0246421 A1 Aug. 3, 2023

Related U.S. Application Data

(63) Continuation of application No. 16/678,535, filed on Nov. 8, 2019, now Pat. No. 11,605,933, which is a
(Continued)

(51) Int. Cl.
*H01S 5/22* (2006.01)
*C23C 14/30* (2006.01)
(Continued)

(52) U.S. Cl.
CPC ............ *H01S 5/2231* (2013.01); *C23C 14/30* (2013.01); *H01L 21/31051* (2013.01);
(Continued)

(58) Field of Classification Search
CPC ............... H01S 5/22–2277; H01S 5/0425
See application file for complete search history.

(56) References Cited

U.S. PATENT DOCUMENTS 3,872,496 A 3/1975 Potter
4,813,052 A 3/1989 Demaria et al.
(Continued)

FOREIGN PATENT DOCUMENTS

CN 101969179 A 2/2011
CN 102213797 A 10/2011
(Continued)

OTHER PUBLICATIONS

Masahiro Aoki, et al. "InP-based reversed mesa ridge waveguide structure for high performance long wavelength lase diode" IEEE Journal of Selected Topics in Quantum Electronics, vol. 3, No. 2, Apr. 1997, pp. 672-683 (Year: 1997).*
(Continued)

*Primary Examiner* — Tod T Van Roy
*Assistant Examiner* — Delma R Forde
(74) *Attorney, Agent, or Firm* — Perilla Knox & Hildebrandt LLP; Jason M. Perilla

(57) ABSTRACT

A laser structure may include a substrate, an active region arranged on the substrate, and a waveguide arranged on the active region. The waveguide may include a first surface and a second surface that join to form a first angle relative to the active region. A material may be deposited on the first surface and the second surface of the waveguide.

20 Claims, 6 Drawing Sheets

Related U.S. Application Data continuation of application No. 15/600,483, filed on May 19, 2017, now abandoned.

(60) Provisional application No. 62/339,581, filed on May 20, 2016.

(51) Int. Cl.

| | |
|---|---|
| *H01L 21/3105* | (2006.01) |
| *H01L 21/67* | (2006.01) |
| *H01L 21/68* | (2006.01) |
| *H01S 5/00* | (2006.01) |
| *H01S 5/02* | (2006.01) |
| *H01S 5/024* | (2006.01) |
| *H01S 5/028* | (2006.01) |
| *H01S 5/042* | (2006.01) |
| *H01S 5/10* | (2021.01) |
| *H01S 5/223* | (2006.01) |
| *H01S 5/343* | (2006.01) |

(52) U.S. Cl.
CPC ........ *H01L 21/67098* (2013.01); *H01L 21/68* (2013.01); *H01S 5/0021* (2013.01); *H01S 5/0202* (2013.01); *H01S 5/0203* (2013.01); *H01S 5/02461* (2013.01); *H01S 5/0282* (2013.01); *H01S 5/0425* (2013.01); *H01S 5/1014* (2013.01); *H01S 5/2202* (2013.01); *H01S 5/2213* (2013.01); *H01S 5/2214* (2013.01); *H01S 5/343* (2013.01); *H01S 5/04254* (2019.08); *H01S 2301/176* (2013.01)

(56) References Cited

U.S. PATENT DOCUMENTS

| | | | |
|---|---|---|---|
| 5,029,175 | A | 7/1991 | Ohnaka et al. |
| 5,291,574 | A | 3/1994 | Levenson et al. |
| 5,615,224 | A | 3/1997 | Cohen |
| 5,770,474 | A | 6/1998 | Kim |
| 5,812,570 | A | 9/1998 | Spaeth |
| 6,051,871 | A | 4/2000 | Delacruz et al. |
| 6,365,968 | B1 | 4/2002 | Qian et al. |
| 6,369,455 | B1 | 4/2002 | Ho et al. |
| 6,375,364 | B1 | 4/2002 | Wu |
| 6,499,888 | B1 | 12/2002 | Wu |
| 6,821,801 | B1 | 11/2004 | Sato et al. |
| 6,996,146 | B1 | 2/2006 | Kahen et al. |
| 7,061,022 | B1 | 6/2006 | Pham et al. |
| 7,271,019 | B1 | 9/2007 | Pham et al. |
| 7,420,999 | B2 * | 9/2008 | Masui ............... B82Y 20/00 372/43.01 |
| 7,542,497 | B2 | 6/2009 | Behfar |
| 7,848,375 | B1 | 12/2010 | Thiyagarajan |
| 8,787,419 | B2 | 7/2014 | Behfar |
| 11,605,933 | B2 | 3/2023 | Dow et al. |
| 2003/0116851 | A1 | 6/2003 | Sett et al. |
| 2004/0152224 | A1 | 8/2004 | Sheppard et al. |
| 2004/0218646 | A1 | 11/2004 | Mihashi et al. |
| 2005/0176165 | A1 | 8/2005 | Kishimoto |
| 2008/0206913 | A1 | 8/2008 | Sun et al. |
| 2010/0316075 | A1 | 12/2010 | Raring et al. |
| 2011/0243493 | A1 | 10/2011 | Kondou et al. |
| 2011/0298006 | A1 | 12/2011 | Hagino et al. |
| 2012/0307857 | A1 | 12/2012 | Oh et al. |
| 2016/0327739 | A1 | 11/2016 | Nakamura et al. |
| 2017/0358902 | A1 * | 12/2017 | Maeda ............... H01S 5/223 |

FOREIGN PATENT DOCUMENTS

| | | | |
|---|---|---|---|
| CN | 105207053 | A | 12/2015 |
| JP | H07263751 | A | 10/1995 |
| JP | H1093191 | A | 4/1998 |
| JP | 2003234528 | A | 8/2003 |
| JP | 2004335530 | A | 11/2004 |
| JP | 2005191380 | A | 7/2005 |
| JP | 2005252229 | A | 9/2005 |
| JP | 2006511942 | A | 4/2006 |
| JP | 2011209629 | A | 10/2011 |
| JP | 2012523718 | A | 10/2012 |
| JP | 2016034013 | A | 3/2016 |
| JP | 2016054168 | * | 4/2016 ............ H01S 5/026 |
| WO | 2004034466 | A2 | 4/2004 |
| WO | 2005017998 | A2 | 2/2005 |

OTHER PUBLICATIONS

M. Aoki, et al. "High performance InGaAsP/InP strained layer MQW lasers with reversed mesa ridge waveguide structures" Electronics Letters Jun. 8, 1995, vol. 31 No. 12, pp. 973-975 (Year: 1995).*
2.1 Silicon Dioxide properties (Sep. 7, 2018), pp. 1-2.
Aoki et al; InP-Based Reversed-Mesa Ridge-Waveguide Structure for High-Performance Long-Wavelength Laser Diodes; IEEE Journal of Selected Topics in Quantum Electronics.; Apr. 1997; vol. 3, No. 2, pp. 672-683.
Faist, J., et al., "Continuous wave operation of a vertical transition quantum cascade laser above T=80 K," Applied Physics Letters, vol. 67, No. 21, pp. 3057-3059, 5 pages in total (Nov. 20, 1995).
Fukuda, M., et al., "Failure Modes of InGaAsP/InP Lasers Due to Adhesives," IEEE Transactions on Components, Hybrids, and Manufacturing Technology, vol. CHMT-7, No. 2, pp. 202-206 (Jun. 1984).
Inoue, Y., et al., "Fabrication of AlxGa1.xAs buried heterostructure laser diodes by in-situ gas etching and selective-area metalorganic vapor phase epitaxy," Journal of Crystal Growth, vol. 145, Issues 1-4, pp. 881-885 (Dec. 1994).
International Search Report and Written Opinion issued by U.S. Patent and Trademark Office as International Searching Authority in International Application No. PCT/US2017/033623, dated Oct. 6, 2017 (14 pages).
Masahiro et a. "Complex permittivity and permeability of Si02 and Fe304 powders in microwave frequency range between 0.2 and 13.5 GHz" ISIJ International, vol. 49 (2009), No. 9, pp. 1443-1448.
Office Action from Japanese Patent Application No. 2018-561061 dated Apr. 12, 2021. (Partial translation).
Office Action from Japanese Patent Application No. 2018-561061 dated Jan. 24, 2022. (Partial translation).
Pan, J.-W. and Chyi, J.-I., "Theoretical study of the temperature dependence of 1.3-μm AlGaInAs—InP multiple-quantum-well lasers", IEEE Journal of Quantum Elect., vol. 32, No. 12, pp. 2133-2138 (Dec. 1996).
Properties of Si02 and Si3N4 at 300K, p. 1 (Year: 2019).
S. Geis et al. "Dielectric constants of Si02 and RF aerogels measured by response function method" Journal of Porous Materials 7, pp. 423-433 (2000).
Sakamoto, M., et al., "120W CW output power from monolithic AlGaAs (800 nm) laser diode array mounted on diamond heatsink," Electronics Letters, vol. 28, Issue 2, pp. 197-199 (Jan. 16, 1992).
Takino, Y., et al., "Improved Regrowth Interface of AlGaInAs/InP-Buried-Heterostructure Lasers by In-Situ Thermal Cleaning", IEEE Journal of Quantum Elect, vol. 48, No. 8, pp. 971-979 (Aug. 2012.
Vurgaftman, I., et al., "High-power/low-threshold type-II interband cascade mid-IR laser-design and modeling," IEEE Photonics Technology Letters, vol. 9, No. 2, p. 170 (Feb. 1997).
Welch, D. F., et al., "Properties of AlGaAs buried heterostructure lasers and laser arrays grown by a two-step metalorganic chemical vapor deposition," Applied Physics Letters, vol. 48, No. 25, pp. 1716-1718, 5 pages in total (Jun. 23, 1986).
Office Action in JP Patent Application No. 2022-177035, Mailed Aug. 17, 2023.

* cited by examiner

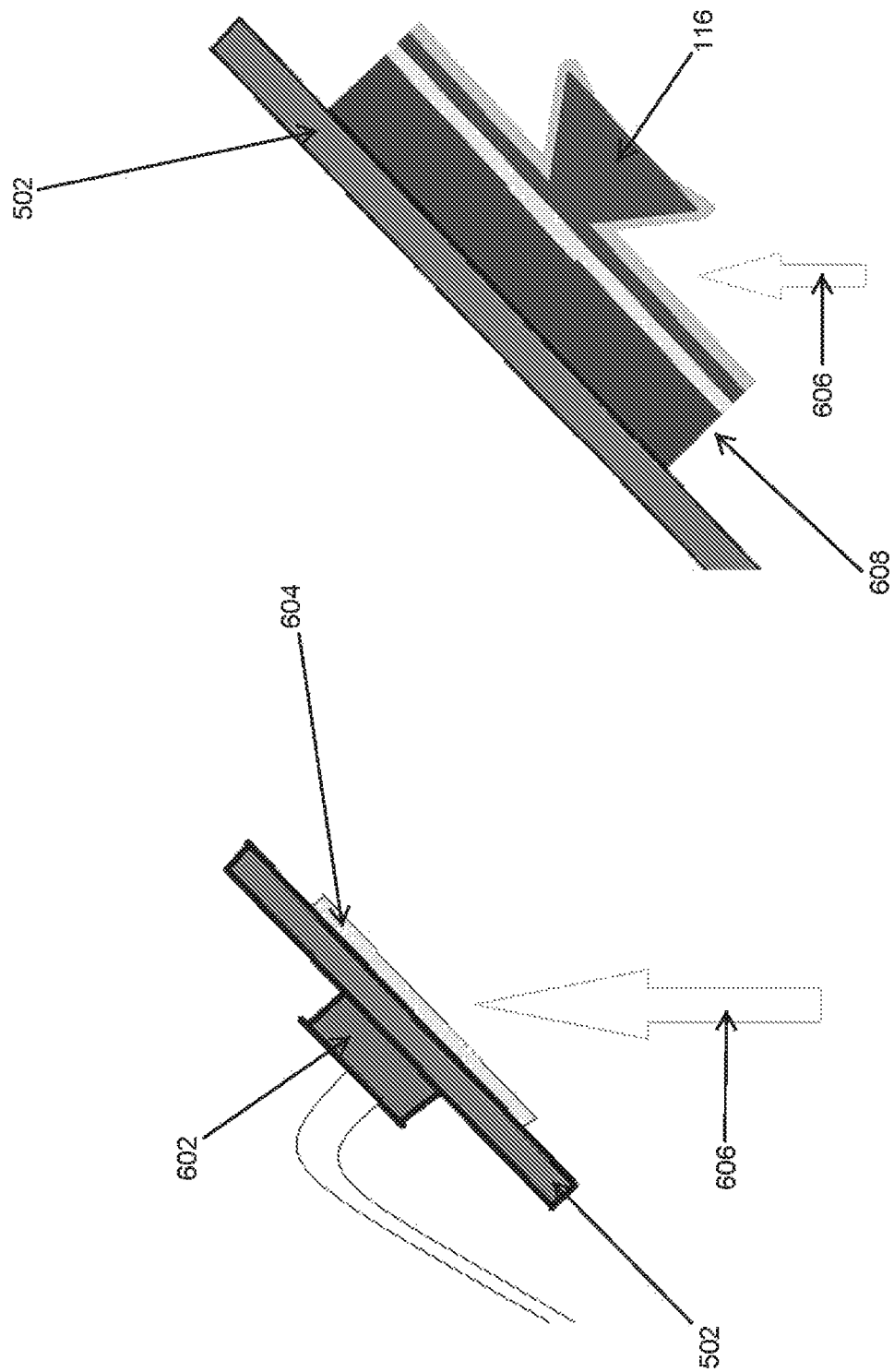

SEMICONDUCTOR LASERS AND PROCESSES FOR THE PLANARIZATION OF SEMICONDUCTOR LASERS

CROSS-REFERENCE TO RELATED APPLICATIONS

This patent application is a continuation of U.S. Non-Provisional Application Ser. No. 16/678,535, titled "SEMICONDUCTOR LASERS AND PROCESSES FOR THE PLANARIZATION OF SEMICONDUCTOR LASERS," filed Nov. 8, 2019, which is a continuation of U.S. Non-Provisional U.S. application Ser. No. 15/600,483, titled, "SEMICONDUCTOR LASERS AND PROCESSES FOR THE PLANARIZATION OF SEMICONDUCTOR LASERS," filed May 19, 2017, which claims the benefit of priority to U.S. Provisional Patent Application No. 62/339,581, filed May 20, 2016, the entire contents of each of which applications is hereby incorporated herein by reference.

FIELD OF THE DISCLOSURE

The present disclosure relates generally to semiconductors, and more particularly, to semiconductor lasers and processes for the planarization of semiconductor lasers.

BACKGROUND OF THE DISCLOSURE

Semiconductor lasers are typically realized on a wafer by epitaxially depositing multiple layers of semiconductor materials such as InP, GaAs, GaN and ternary or quaternary semiconductor material on a wafer using Metalorganic Chemical Vapor Deposition (MOCVD) or Molecular Beam Epitaxy (MBE) deposition on a semiconductor substrate surface. Subsequently, multiple semiconductor fabrication steps are applied to the wafer to realize a laser optical cavity which contains a device active region with facets and metallic electrical contacts. Typically, facets are formed by cleaving or etching the semiconductor material. The application of an electrical potential allows for electrical current flow through the active region of the device which causes photons to be emitted out of the facets.

During the operation of semiconductor laser diodes, a large amount of heat is generated within the active region of the device. Generally, the performance of laser diodes is better when the active region is at a lower temperature. Most laser diodes are mounted active-side-up where the substrate is in contact with a thermally conductive material such as an AlN submount. Alternatively, laser diodes with appropriate designs may be mounted active-side-down to reduce a thermal path between the active region and the submount.

Lasers play a large role in optical communication systems. Some of the transmission speeds are at or above 25 Gbits per second and the lasers are typically required to operate at temperatures above 50° C. Typically, the hotter the active region, the worse the high speed performance of the semiconductor laser. As such, heat spreading and heat removal from the active region remains a significant challenge in achieving high speed operations, especially at elevated temperatures.

At high frequencies of operation, laser capacitance can impact the performance that can be obtained from a semiconductor laser. As such, reduction of capacitance associated with the laser at high frequencies may be necessary to allow appropriate performance of the laser.

A Buried-Heterostructure (BH) approach can be used for spreading heat away from the active region of a laser. Such an approach typically involves etching through the active region and regrowing a high thermal conductivity thin film such as InP using either MOCVD or MBE to create a good thermal flow path from the active region to a device metal layer. However, there are some disadvantages of this approach. Most high-performance laser active regions incorporate Al. Etching through an active region with Al content typically results in the formation of aluminum oxide ($AlO_2$) on sidewalls of the active layer. Aluminum oxide is hard to remove prior to regrowth required in the formation of a BH laser. The presence of aluminum oxide may result in defects in subsequent layers during the regrowth process that may degrade device performance. Furthermore, subsequent regrowth adds cost. The following publications highlight various approaches to address such challenges: "Improved Regrowth Interface of AlGaInAs/InP-Buried-Heterostructure Lasers by In-Situ Thermal Cleaning" by Takino, et al., IEEE Journal of Quantum Electronics, Volume. 48, Number 8, pages 971-979, August 2012; "Theoretical study of the temperature dependence of 1.3 µm AlGaInAs—InP multiple-quantum-well lasers" by Pan, et al., IEEE Journal of Quantum Electronics, Volume 32, Number 12, pages 2133-2138; December 1996 and U.S. Pat. No. 6,821,801 B1.

In view of the foregoing, it can be appreciated that there may be a need for a high-performance laser that does not rely on expensive BH technology.

SUMMARY OF THE DISCLOSURE

In some embodiments, a laser structure may include a substrate, an active region arranged on the substrate, and a waveguide arranged on the active region. The waveguide may include a first surface and a second surface that join to form a first angle relative to the active region. The laser structure may further include a material deposited on the first surface and the second surface of the waveguide.

In some embodiments, the first angle may be less than ninety degrees.

In some embodiments, the waveguide may further include a third surface and a fourth surface that join to form a second angle relative to the active region. The material may be deposited on the third surface and the fourth surface.

In some embodiments, the second angle may be less than ninety degrees.

In some embodiments, the material may be one of MgO, $MgF_2$, $SiO_2$, or $Si_3N_4$.

In some embodiments, the material may have a dielectric constant below 10 in a frequency range up to 50 GHz.

In some embodiments, the material may be non-conducting.

In some embodiments, the waveguide may include a fifth surface arranged between the first surface and the third surface, and the laser structure may further include a first contact arranged on the fifth surface and a second contact arranged on the substrate. The first contact may be configured to bias the laser structure by delivering electrical current to the laser structure.

In some embodiments, the laser structure may further include at least one facet.

In some embodiments, the at least one facet may be formed in the active region.

In some embodiments, a laser structure may include a substrate, an active region arranged on the substrate, and a waveguide arranged on the active region. The waveguide may include a first ridge and a second ridge. The first ridge may form a first air gap and the second ridge may form a second air gap. The laser structure may further include a metal layer arranged as a bridge over the first and second air gaps.

In some embodiments, the first ridge may form a first angle of less than ninety degrees relative to the active region and the second ridge may form a second angle of less than ninety degrees relative to the active region.

In some embodiments, a first contact may be arranged on a surface of the waveguide and the first contact may be configured to bias the laser structure by delivering electrical current to the laser structure.

In some embodiments, the laser structure may further include at least one facet.

In some embodiments, the at least one facet may be formed in the active region.

In some embodiments, a method of fabricating a laser structure may include arranging an active region on a substrate and arranging a waveguide on the active region. The waveguide may include a first ridge and a second ridge. The method may further include depositing a polymer on the waveguide such that the polymer coats underneath the first ridge and second ridge, depositing at least one layer of resist on the polymer, depositing a metal layer on the at least one layer of resist, and removing the deposited polymer and the deposited at least one layer of resist.

In some embodiments, the first ridge may form a first angle of less than ninety degrees relative to the active region and the second ridge may form a second angle of less than ninety degrees relative to the active region.

In some embodiments, the method may further include arranging a first contact on a surface of the waveguide. The first contact may be configured to bias the laser structure by delivering electrical current to the laser structure.

In some embodiments, the method may further include forming at least one facet in the active region.

In some embodiments, the at least one facet may be formed by etching.

In some embodiments, a fixture for electron beam evaporation may include a wafer plate configured to support a laser structure and an integrated heater configured to emit heat at an evaporation temperature. The heat emitted by the integrated heater may be adjustable and an angle of the fixture may be adjustable.

In some embodiments, the wafer plate may be further configured to orient the laser structure relative to an evaporant.

In some embodiments, the orientation of the laser structure may subject at least one ridge of the laser structure to the evaporant.

In some embodiments, the orientation of the laser structure may be varied based on an angle of at least one ridge of the laser structure.

The present disclosure will now be described in more detail with reference to particular embodiments thereof as shown in the accompanying drawings. While the present disclosure is described below with reference to particular embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be illustrative only.

FIG. 6A shows an adjustable fixture in accordance with embodiments of the present disclosure.

FIG. 6B shows an adjustable fixture in accordance with embodiments of the present disclosure.

DETAILED DESCRIPTION OF EMBODIMENTS

The present disclosure and the related advantages are described and highlighted in the following description and accompanying figures which are not necessarily drawn to scale. Detailed descriptions of structure and processing techniques are omitted so as to not unnecessarily obscure the present disclosure.

Figure 1:
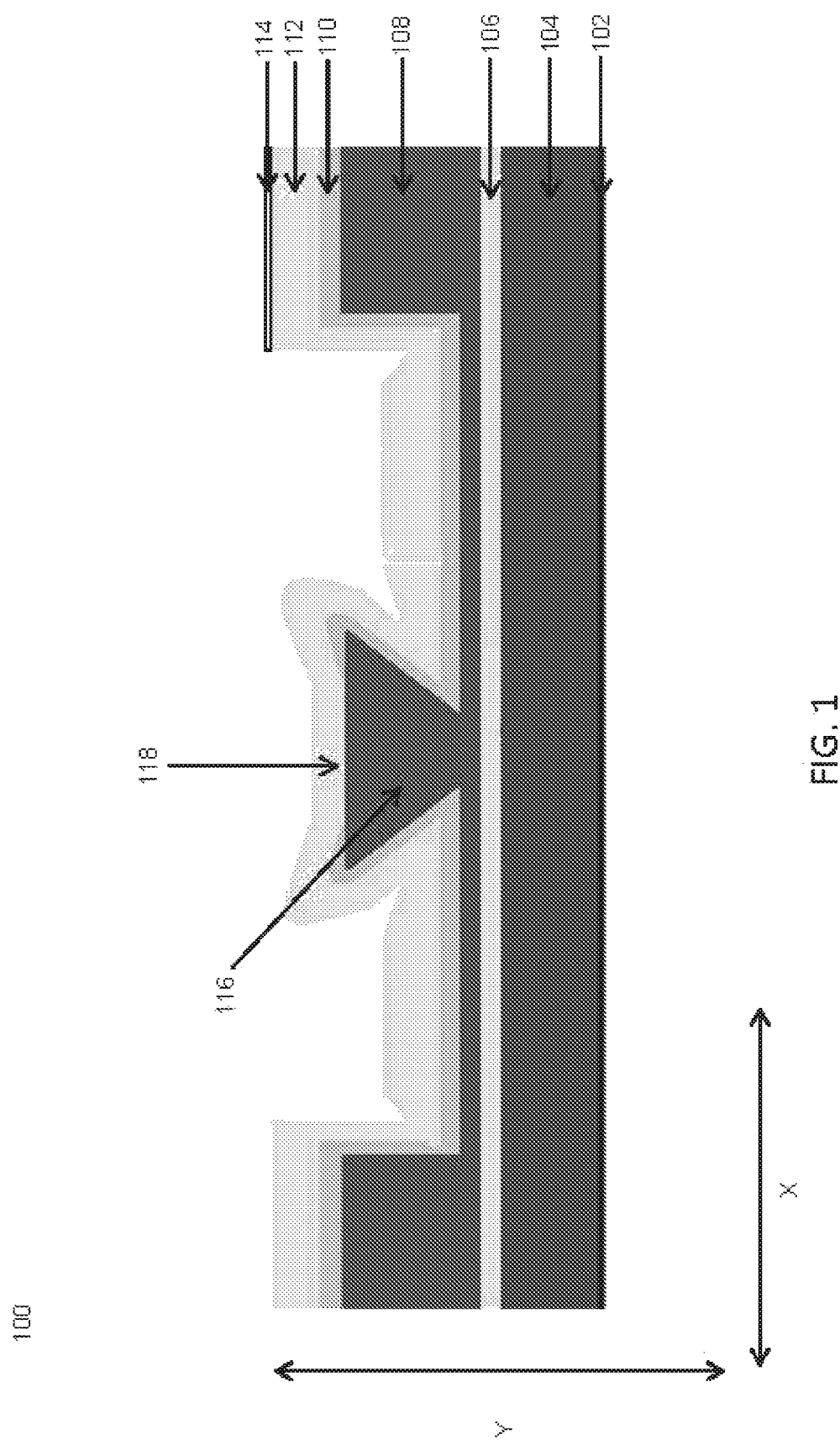
FIG. 1 shows a cross section of a semiconductor laser in accordance with embodiments of the present disclosure.

FIG. 1 shows a cross section of a semiconductor laser 100. Laser 100 is a dovetail ridge waveguide laser structure with at least one electrical contact. Laser 100 may include a bottom layer 102. Bottom layer 102 may be a metal layer, and may provide an electrical contact layer adjacent to layer 104. Layer 104 may be an N-type semiconductor, and may be located between layers 102 and active region 106. Layer 104 may be an InP substrate, for example. Active region 106 may provide for the emission of photons from laser 100. Layer 108 may be located adjacent to active region 106. Layer 108 may be a P-type semiconductor. Layer 108 may include a dovetail ridge waveguide (RWG) 116. Layer 110 may be located adjacent to layer 108. Layer 110 may be an insulation layer. For example, layer 110 may be an insulation layer of $SiO_2$ deposited on layer 108 to cover exposed surfaces of layer 108. On the top of dovetail RWG 116, an opening 118 in layer 110 may be formed. A top metal layer 112 may be deposited over layer 110 and over the opening in layer 110 on dovetail RWG 116. Top metal layer 112 may therefore provide an electrical contact layer for biasing the device on the p-side via the opening in layer 110 on dovetail RWG 116. A bond pad 114 may be attached to top metal layer 112. Chemically assisted ion beam etch (CAIBE) may be used to form etched facets on a face of laser 100 defined by the X and Y axes of laser 100, shown in FIG. 1. The facets may be etched in active layer 106. Cleaving could also be used to form the etched facets.

Laser 100 may provide a high degree of topology. Laser 100, however, may include reduced p-side metal coverage and a reduced thermal conductivity path from active region 106. Dovetail RWG 116 may form a smaller ridge width relative to other ridge widths. The ridge width of dovetail RWG 116 may be configured to confine light, but may also be configured to allow a larger area for a p-side metal contact to reduce contact resistance.

Dovetail RWG 116 may be formed as part of layer 108. RWG 116 may include a top surface and two side surfaces. Each side surface may form an angle with another surface of layer 108 relative to active region 106 to form a ridge of RWG 116. Each angle may be less than 90°.

Figure 2:
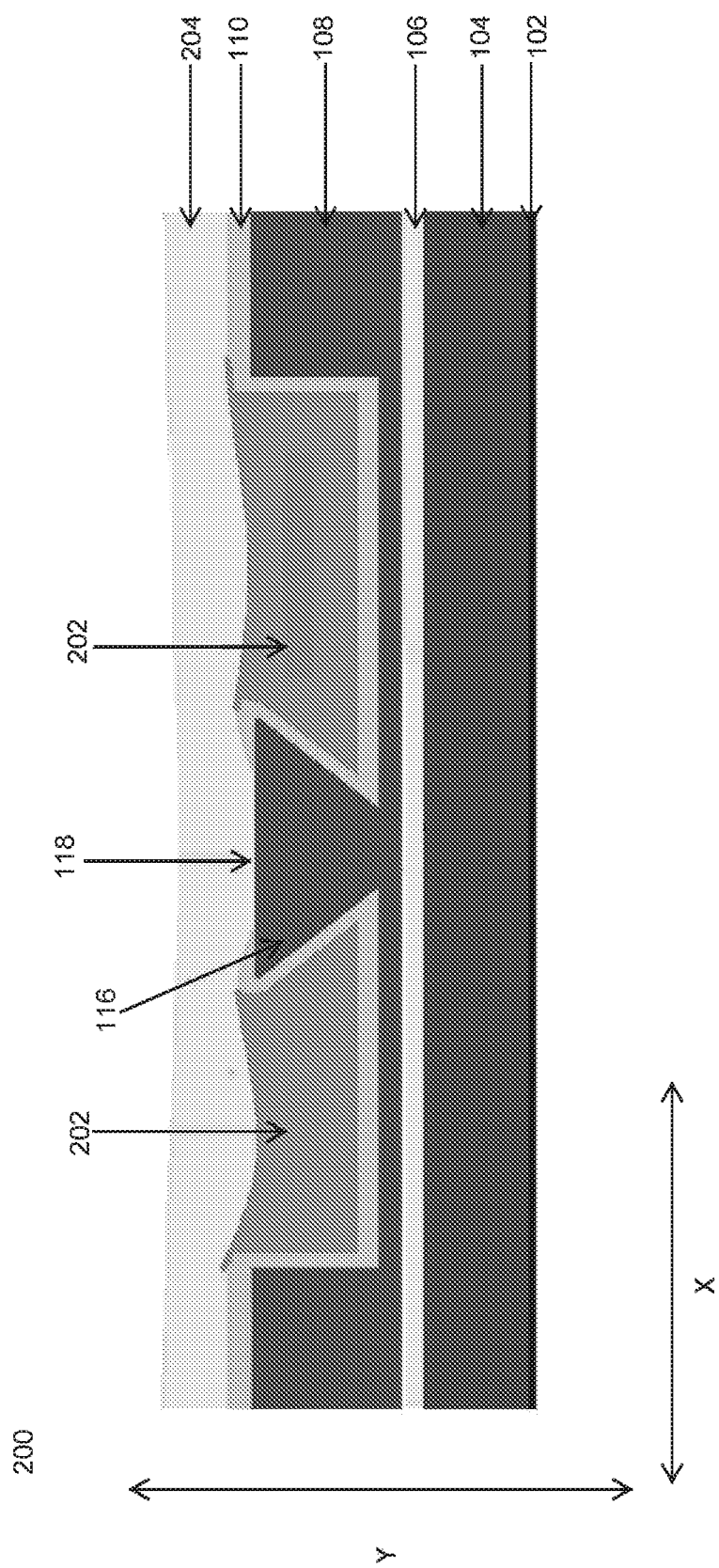
FIG. 2 shows a cross section of another semiconductor laser in accordance with embodiments of the present disclosure.

FIG. 2 shows cross section of a semiconductor laser 200. Laser 200 is similar to laser 100 of FIG. 1 because it similarly includes active region 106, and layers 102, 104, 108, and 110. Laser 200 also includes dovetail RWG 116 and opening 118. Laser 200, however, further includes a polymer 202 disposed adjacent to layer 110 for capacitance reduction and planarization to significantly improve a thermal conductivity path from the active region. Polymer 202 may be a photo-sensitive polymer. Laser 200 also additionally includes layer 204. Layer 204 may be a metal layer, similar to layer 112. Semiconductor laser 200 may provide excellent planarization and significant capacitance reduction, as well as significant thermal conductivity improvements. However, laser 200 may exhibit changes to threshold current, laser wavelength, and/or a side mode suppression ratio after thermal processing such as metallization annealing and soldering. These performance changes may inhibit use of polymer 202.

Figure 3:
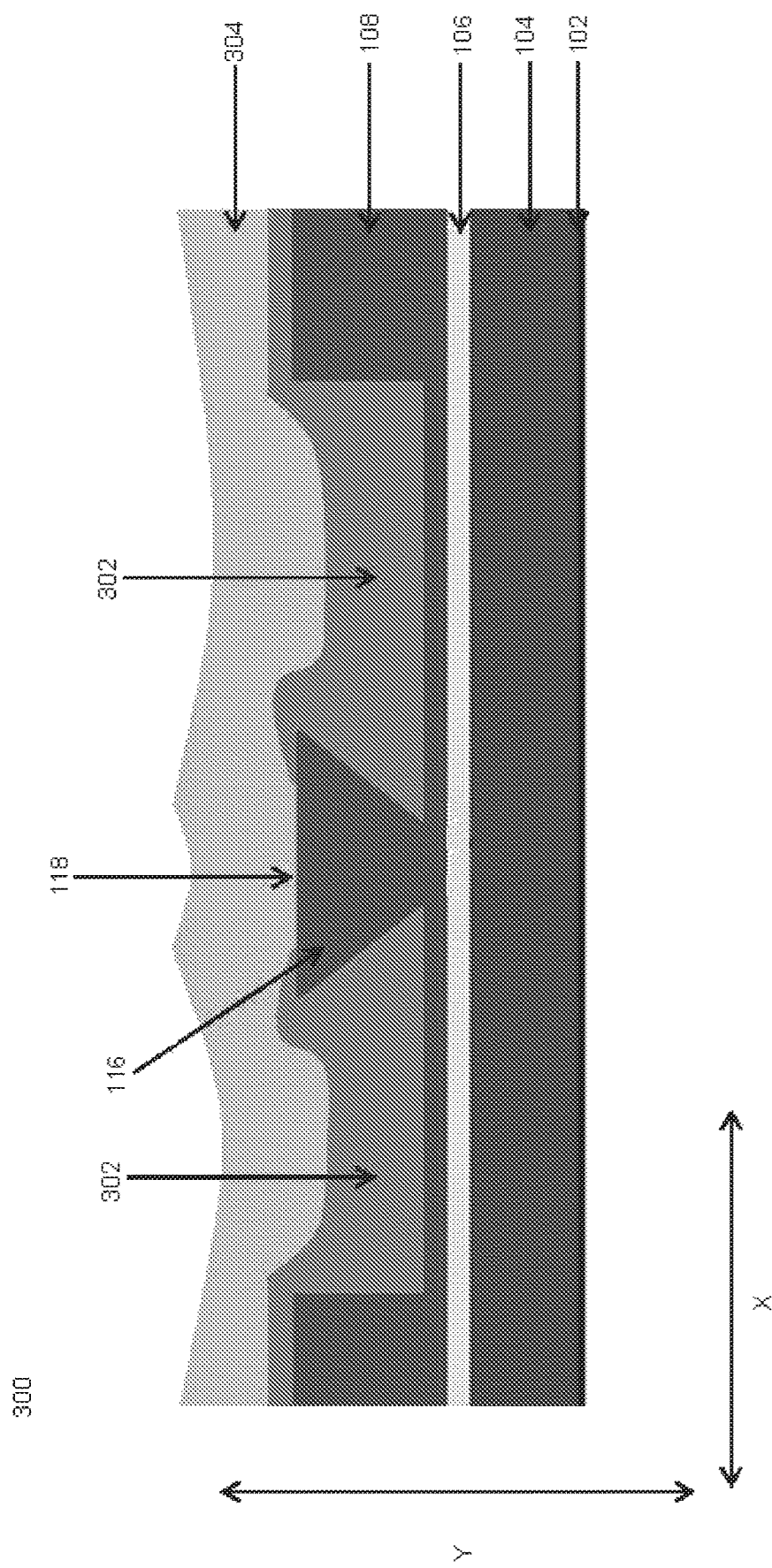
FIG. 3 shows a cross section of another semiconductor laser in accordance with embodiments of the present disclosure.

FIG. 3 shows a cross-section of semiconductor laser 300. Laser 300 is similar to lasers 100 and 200 in that it includes active region 106, and layers 102, 104, and 108. Laser 300 also includes dovetail RWG 116 and opening 118. Laser 300, however, further includes a material 302 and metal layer 304. Laser 300 may be planarized using a lift-off process for the deposition of material 302 on layer 108 and dovetail RWG 116 such that opening 118 remains. Material 302 may be formed from MgO, $MgF_2$, $SiO_2$, $Si_3N_4$, and/or other non-electrically conducting materials with low relative dielectric constant (for example, below 10) in a frequency range up to 50 GHz, or in the 10-50 GHz frequency range, for example. The dielectric constant may be less than 10 in order to reduce capacitance, and may be closer to 1.

Using the planarization as discussed above may provide cooling of the semiconductor laser active region using material 302. Material 302 may be evaporated onto laser 300, and may form an evaporated thin film on laser 300. The evaporation may provide adherence to a variety of surfaces, such as semiconductors, insulators, and/or metals, and may further provide adherence to a variety of topologies and shapes formed by such surfaces, such as a dove tailed ridge. The evaporation may further allow for targeted deposition. Metal 304 may be similar to layer 204 discussed above.

MgO can be used as an illustrative example of the low relative dielectric material 302 that may be used for planarization. MgO can adhere to a variety of surfaces and topography using evaporation. For example, electron beam evaporation of MgO onto a heated substrate of laser 300 (such as layer 108, for example) that is patterned may allow for deposition to occur in targeted areas. MgO has a thermal conductivity of 43 W/mK which may enable heat conduction from active region 106 of laser 300.

Further, MgO can also be used to planarize a surface of laser 300 allowing for less complicated metallization techniques which have improved characteristics. For example, current photosensitive planarization polymers may have poor thermal conductance. Utilizing the dovetail ridges for low electrical resistance (and large contact area) of laser 300, as well as electron beam or thermal evaporation of MgO on laser 300, may allow for a robust low cost fabrication process. The planarization described may provide a durable technique in reducing the semiconductor laser device temperature that can also be applied to other semiconductor devices.

MgO may also include a complex refractive index that is appropriate for the semiconductor laser structure since it may have a reduced absorption at the laser wavelength. Here, the imaginary component of refractive index may be very low and the real component of refractive index may be appropriate for allowing appropriate waveguiding for laser 300.

One important advantage of the planarization of the present disclosure is that it may improve the path for dissipating the heat from and active region (such as active region 106) of a semiconductor laser. Heat may be generated in a dovetail RWG (e.g., RWG 116) by resistive or Joule heating, and heat may also be generated in the active region. This heat can be conducted away from the laser through the substrate (which may, for example, be made from InP), laterally through a dielectric (for example, MgO), or through a metal contact on the top of the RWG.

FIG. 1 shows a structure where the metal layer 112 is deposited so as to wrap around the sides of the RWG 116. Deposition of the metal, even in a planetary or rocking fixture, may lead to a thinner layer of metal layer 112 on the ridge sidewalls of RWG 116 as the sidewalls may never be normally facing to the metal deposition source. The thinner layer of metal layer 112 may present a restricted thermal path from the top of RWG 116 to a bond pad 114 in FIG. 1. FIG. 3 shows a structure where the ridge areas to each side of RWG 116 have been filled with a dielectric (e.g., material 302). This planarizes the structure and allows metal 304 to be deposited at near to normal incidence. The metal 304 may be deposited as a thicker flat layer that may offer a better path for heat energy to reach the bond pad area. An air bridge has also been used to planarize the structure, and will be discussed in relation to FIG. 4.

Figure 4:
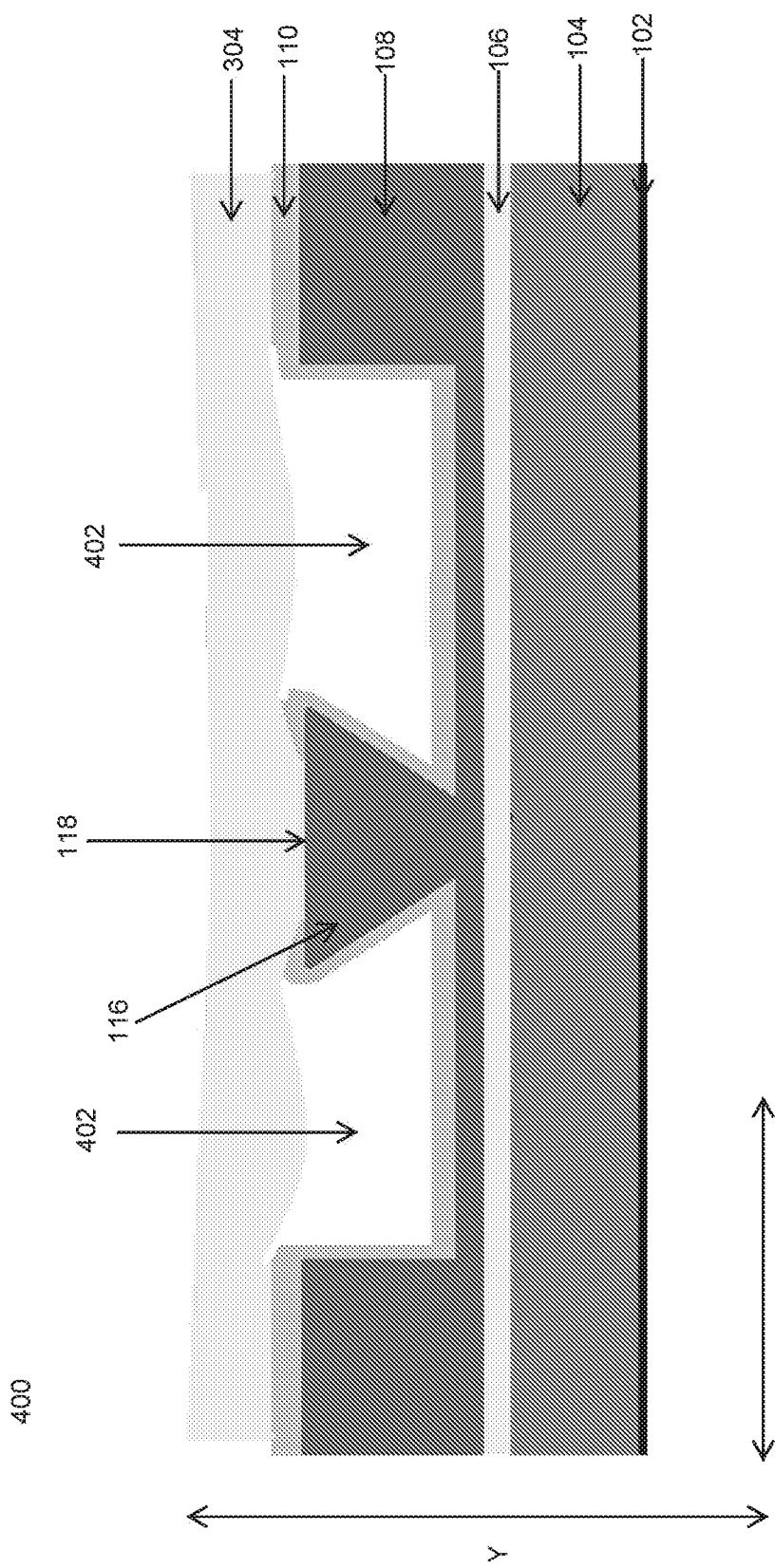
FIG. 4 shows a cross section of another semiconductor laser in accordance with embodiments of the present disclosure.

FIG. 4 shows a cross-section of semiconductor laser 400. Semiconductor laser 400 is similar to laser 300 in that it includes active region 106, and layers 102, 104, and 108. Laser 400 also includes dovetail RWG 116, opening 118, layer 110, and metal 304. Laser 400, however, also includes air gaps 402. Metal 304 acts as a metal air-bridge over air gaps 402, and is configured to connect a bond pad to the top of laser 400. Laser 400 is formed by removing a polymer (formed from polymer 202, for example) from either side of dovetail RWG 116 to form air gaps 402. The polymer may be removed using solvents after metal 304 has been deposited on the structure, for example. Part or all of the polymer may be removed as follows.

A first layer of resist may be planarized onto the structure and patterned such that it fills each side of dovetail RWG 116. The first layer of resist may then be cured such that, for example, it is not soluble in a developer, but may still be soluble in acetone and other resist stripping agents. A second layer of resist may then be patterned on top of the first layer to form a lift-off structure. After metal evaporation of metal 304 on the structure, the layers of resist may be removed, removing the polymer and leaving air gaps 402 between layer 110 and metal 304. This design may reduce unstable laser operation and may provide a thick planarized metal film for heat conduction.

Figure 5:
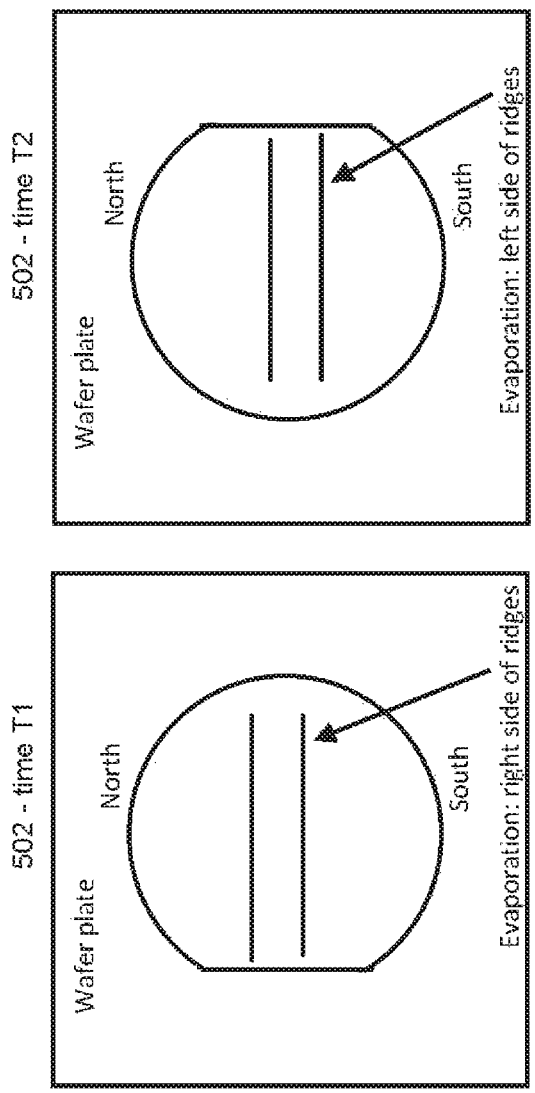
FIG. 5 shows top side views of an adjustable fixture configured to support a semiconductor structure in accordance with embodiments of the present disclosure.

FIG. 5 shows top side views of adjustable fixture 502. A semiconductor laser may be attached to fixture 502 via a wafer plate, and evaporation may be performed to turn the laser into a semiconductor laser 300. When the laser is attached to fixture 502, fixture 502 may be positioned such that electron-beam evaporation of material 302 (such as MgO, for example) onto right and left sides of dovetail RWG 116 of the laser and underneath dovetail RWG 116 may be performed. As indicated by FIG. 5, fixture 502 may be used for evaporation on the right side ridges of dovetail RWG 116, and may provide for such evaporation at a time T1. Fixture 502 may be repositioned, thereby repositioning the laser, and used for evaporation on the left side ridges of dovetail RWG 116 on the laser at a time T2. Laser 300 may thereby be formed.

Fixture 502 may include an integrated heater that may adjust evaporation temperature for improved evaporated thin-film properties. The flexibility of the setup provided by fixture 502 may allow for the accommodation of a wide range of angled dovetail structures. FIGS. 6A and 6B show different configurations of fixture 502. FIG. 6A shows fixture 502 with heater 602. Fixture 502 supports a wafer 604 and holds it in place for evaporation of a material, such as material 302 via evaporation stream 606, onto it. Wafer 604 may be any kind of semiconductor device. As discussed above, heater 602 may be used to adjust evaporation temperature when an evaporant stream 606 of material 302 is directed toward wafer 604. Fixture 502 may be adjusted to different angles such that evaporant stream 606 can be applied to different areas of wafer 604. Moreover, the rate at which evaporation stream 606 is applied to wafer 604 may be adjustable.

FIG. 6B shows fixture 502 configured to support a laser 608. Heater 602 is not shown in FIG. 6B, but may be integrated into fixture 502. Alternatively, heater 602 may be an external unit as shown in FIG. 6A. Laser 608 include the same elements as laser 300, except material 302 evaporated onto it. Via evaporant stream 606, material 302 may be evaporated onto laser 608 to form laser 300. For example, fixture 502 may be angled such that laser 608 and dovetail RWG 116 is oriented toward evaporant stream 606. Evaporant stream 606 may therefore be evaporated onto laser 608 and on a surface of RWG 116. As discussed above, material 302 may be MgO. Therefore, MgO may be deposited onto laser 608 via evaporant stream 606. Fixture 502 may be positioned at an angle of 45° as shown in FIG. 6B. Fixture 502, however, may be adjustable such that it forms an angle ranging from 0° to 360°. Also, heater 602 can be varied from ambient temperature to 300° C., for example. For example, the temperature during evaporation may be 105° C. Changes in substrate temperature during evaporation may impact evaporated film density on laser 608 and optical/thermal properties of laser 608. Fixture 502 therefore provides for evaporation via electron beam evaporation at low substrate temperatures and control of evaporation angle and wafer temperature, and thereby provides planarization of devices, such as laser 608.

Using fixture 502, the growth of highly thermal conductive material on the ridge sidewalls of dovetail RWGs using compatible and low cost techniques like electron beam evaporation or sputtering techniques may be performed. Tunable semiconductor devices may therefore be produced.

Planarization using material 302 can be performed, where material 302 may be MgO, $MgF_2$, $SiO_2$, $Si_3N_4$, and/or other dielectrics. Thermal conductivity may be slightly improved using MgO and $MgF_2$ compared to $SiO_2$. Such planarized structures may exhibit significant capacitance reduction and an improved thermal conductive path from the active region. Unlike the case of a polymer, device characteristics may remain stable after significant thermal processing, such as metallization annealing and soldering. Also, mechanical strength of the dovetail ridge may be improved.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of at least one particular implementation in at least one particular environment for at least one particular purpose, those of ordinary skill in the art will recognize that its usefulness is not limited thereto and that the present disclosure may be beneficially implemented in any number of environments for any number of purposes.

The invention claimed is:

1. A laser structure, comprising:
   a substrate;
   an active region over the substrate;
   a semiconductor layer over the active region, the semiconductor layer comprising a dovetail waveguide, the dovetail waveguide comprising a central top waveguide surface;
   a metal layer extending over the semiconductor layer and contacting the central top waveguide surface a first air gap under the metal layer at a first side of the dovetail waveguide and a second air gap under the metal layer at a second side of the dovetail waveguide; and
   an insulating layer over the semiconductor layer, under the metal layer, under the first air gap at the first side of the dovetail waveguide, and under the second air gap at the second side of the dovetail waveguide.

2. The laser structure of claim 1, wherein the metal layer comprises a bridge over the first air gap and the second air gap.

3. The laser structure of claim 1, wherein:
   the semiconductor layer comprises a first side surface, a second side surface, a top surface, and a lower surface; and
   the dovetail waveguide is positioned between the first side surface and the second side surface of the semiconductor layer.

4. The laser structure of claim 3, wherein the dovetail waveguide comprises a first waveguide side surface, a second waveguide side surface, and the central top waveguide surface.

5. The laser structure of claim 4, wherein:
   the first waveguide side surface joins the lower surface of the semiconductor layer at a first angle; and
   the second waveguide side surface joins the lower surface of the semiconductor layer at a second angle.

6. The laser structure of claim 5, wherein:
   the first angle is less than ninety degrees; and
   the second angle is less than ninety degrees.

7. The laser structure of claim 1, wherein the insulating layer is on the semiconductor layer and under the metal layer.

8. The laser structure of claim 1, wherein the insulating layer comprises $SiO_2$.

9. The laser structure of claim 1, insulating layer wherein:
   the insulating layer comprises an opening at the central top waveguide surface of the dovetail waveguide; and
   the metal layer contacts the central top waveguide surface of the dovetail waveguide through the opening.

10. The laser structure of claim 1, wherein:
    the semiconductor layer comprises a first side surface, a second side surface, a top surface, and a lower surface;

the dovetail waveguide is positioned between the first side surface and the second side surface of the semiconductor layer;

the dovetail waveguide comprises a first waveguide side surface, a second waveguide side surface, and the central top waveguide surface; and the insulating layer is on the first side surface, the second side surface, the top surface, and the lower surface of the semiconductor layer and is on the first waveguide side surface, the second waveguide side surface, and at least a portion of the central top waveguide surface of the dovetail waveguide.

11. The laser structure of claim 10, wherein:
the insulating layer comprises an opening at the central top waveguide surface of the dovetail waveguide; and
the metal layer contacts the central top waveguide surface of the dovetail waveguide through the opening.

12. The laser structure of claim 1, further comprising a bond pad, wherein the metal layer is electrically connected between the bond pad and the central top waveguide surface of the dovetail waveguide.

13. A laser structure, comprising:
a substrate;
an active region over the substrate;
a semiconductor layer over the active region, the semiconductor layer comprising a waveguide, the waveguide comprising a central top waveguide surface;
a metal layer extending over the semiconductor layer and contacting the central top waveguide surface a first air gap under the metal layer at a first side of the waveguide and a second air gap under the metal layer at a second side of the waveguide; and
an insulating layer over the semiconductor layer, under the metal layer, under the first air gap at the first side of the waveguide, and under the second air gap at the second side of the waveguide.

14. The laser structure of claim 13, wherein the metal layer comprises a bridge over the first air gap and the second air gap.

15. The laser structure of claim 13, wherein:
the waveguide comprises a dovetail waveguide;
the semiconductor layer comprises a first side surface, a second side surface, a top surface, and a lower surface; and
the dovetail waveguide is positioned between the first side surface and the second side surface of the semiconductor layer.

16. The laser structure of claim 15, wherein the dovetail waveguide comprises a first waveguide side surface, a second waveguide side surface, and the central top waveguide surface.

17. The laser structure of claim 16, wherein:
the first waveguide side surface joins the lower surface of the semiconductor layer at a first angle;
the second waveguide side surface joins the lower surface of the semiconductor layer at a second angle;
the first angle is less than ninety degrees; and
the second angle is less than ninety degrees.

18. The laser structure of claim 13, wherein the insulating layer is on the semiconductor layer and under the metal layer.

19. The laser structure of claim 13,
wherein:
the insulating layer comprises an opening at the central top waveguide surface of the waveguide; and
the metal layer contacts the central top waveguide surface of the waveguide through the opening.

20. The laser structure of claim 13, wherein:
the semiconductor layer comprises a first side surface, a second side surface, a top surface, and a lower surface;
the waveguide is positioned between the first side surface and the second side surface of the semiconductor layer;
the waveguide comprises a first waveguide side surface, a second waveguide side surface, and the central top waveguide surface; and
the insulating layer is on the first side surface, the second side surface, the top surface, and the lower surface of the semiconductor layer and is on the first waveguide side surface, the second waveguide side surface, and at least a portion of the central top waveguide surface of the waveguide.

* * * * *

UNITED STATES PATENT AND TRADEMARK OFFICE
CERTIFICATE OF CORRECTION

| | | |
|---|---|---|
| PATENT NO. | : 12,355,212 B2 | Page 1 of 1 |
| APPLICATION NO. | : 18/174250 | |
| DATED | : July 8, 2025 | |
| INVENTOR(S) | : Dow et al. | |

It is certified that error appears in the above-identified patent and that said Letters Patent is hereby corrected as shown below:

In the Claims

Column 8, in Line 60, Claim 9 delete:
"9. The laser structure of claim 1, insulating layer wherein:"
And replace with:
"9. The laser structure of claim 1, wherein:"

Signed and Sealed this
Fourteenth Day of October, 2025

John A. Squires
*Director of the United States Patent and Trademark Office*